United States Patent [19]

Converse et al.

[11] Patent Number: 4,725,785
[45] Date of Patent: Feb. 16, 1988

[54] DIRECTIONAL POTENTIAL ANALYZER METHOD AND APPARATUS FOR DETECTING AND LOCATING LEAKS IN GEOMEMBRANE LINERS

[75] Inventors: Merle E. Converse, Helotes; Kathryn B. Glass, San Antonio; Thomas E. Owen, Helotes, all of Tex.

[73] Assignee: Southwest Research Institute, San Antonio, Tex.

[21] Appl. No.: 810,023

[22] Filed: Dec. 17, 1985

[51] Int. Cl.[4] ....................... G01R 31/16; G08B 21/00
[52] U.S. Cl. .................................. 324/559; 340/605; 324/523; 324/528
[58] Field of Search ..................... 324/51–54, 324/352, 357, 64, 65 R, 65 P, 557, 559, 528, 523, 522, 512, 527; 340/603, 605

[56] References Cited

U.S. PATENT DOCUMENTS

| | | | |
|---|---|---|---|
| 3,383,863 | 5/1968 | Berry | 324/65 P |
| 3,526,831 | 9/1970 | Smith | 324/54 |
| 3,863,146 | 1/1975 | Ehret | 324/54 |
| 3,965,415 | 6/1974 | Ehret | 324/54 |
| 4,063,161 | 12/1977 | Pardis | 324/65 P X |
| 4,101,827 | 7/1978 | Offner | 324/65 R |
| 4,131,773 | 12/1978 | Maham et al. | 324/65 R X |
| 4,161,689 | 7/1979 | Schlosberg et al. | 324/54 |
| 4,404,516 | 9/1983 | Johnson, Jr. | 324/54 |
| 4,543,525 | 9/1985 | Boryta et al. | 324/54 |

Primary Examiner—Reinhard J. Eisenzopf
Assistant Examiner—Warren S. Edmonds
Attorney, Agent, or Firm—Gunn, Lee & Jackson

[57] ABSTRACT

A directional potential analyzer method and apparatus using a non-intrusive electrical measurement technique to obtain a precise location of a leak in a geomembrane liner. The method and apparatus can be used for detecting leaks in either a single layer or a two layer geomembrane liner. The directional potential analyzer comprises a differential voltage detection probe which is moved through the liquid with the potential difference between the electrodes on the probe being measured and recorded as a function of azimuthal position of the probe. An initial scan of the liquid impoundment is used as a reference trace showing all of the anomalies of an unfaulted liner. Subsequent traces obtained by rotating the analyzer probe at a later date are processed and compared with the reference trace to determine the occurrence of new anomalies representing leaks in the liner. In an alternate embodiment of the invention, two directional analyzers are employed and a triangulation analysis is used to obtain a more precise location of a leak in the liner.

6 Claims, 10 Drawing Figures

DIRECTIONAL POTENTIAL ANALYZER METHOD AND APPARATUS FOR DETECTING AND LOCATING LEAKS IN GEOMEMBRANE LINERS

FIELD OF THE INVENTION

The present invention relates to a method and apparatus for locating leaks in geomembrane liners used to contain liquids in surface impoundment facilities. More specifically, the present invention uses a nonintrusive electrical measurement technique to obtain a precise location of a leak in a geomembrane liner. Furthermore, the invention method and apparatus can be used to detect and locate leaks occurring in a single-layer geomembrane liner or in either the upper or the lower layer of a two-layer geomembrane liner.

BACKGROUND

Geomembrane liners (often called flexible liners) are large sheets of plastic or rubber material used as a barrier to contain liquids in a surface structure. Facilities where these liners are commonly used include hazardous waste landfills and liquid impoundments, water reservoirs, and other surface impoundments.

At certain types of facilities, such as hazardous liquid surface impoundments, the geomembrane liner is often comprised of two separate layers of liner material to provide an additional margin of containment. A two-layer geomembrane liner consists of a lower plastic sheet typically made of high-density polyethylene or other polymeric material, a water-permeable intermediate material made of loosely woven or fusion-bonded plastic stringers (or, in some cases, a sand layer of several inches thickness), and an upper plastic sheet similar to the lower sheet. The grade of the bottom of the impoundment is constructed with an incline to accommodate a sump drain to collect any leakage from the impoundment through the upper liner and into the interliner zone.

There are no previous nonintrusive methods to indicate whether leakage is occurring through the lower liner sheet or the sump structure. However, leak problems and ground water contamination have been reported in the lower sheet of two-layer liners at some facilities and there is need for a method for detecting and locating such leaks for subsequent repair. Furthermore, those leaks which have been detected have become apparent only after substantial leakage had occurred. One embodiment of the present invention solves this difficulty by providing a method and apparatus for separately detecting and locating leaks in either the upper or the lower sheet of a two layer geomembrane liner.

Previous methods for monitoring the performance of liners after installation and use have typically been based on ground water sampling using a plurality of monitoring wells at spaced intervals along the perimeter of the impoundment. The ground water sampling method, however, provides only an indirect and delayed indication of leakage and, therefore, is not adequate for monitoring liner performance since ground water contamination may take years to occur. Furthermore, by the time a leak has been determined by this method, substantial ground water contamination may have already occurred.

Another source of inadequacy in the ground water sampling method stems from the need to have the monitoring well in the particular aquifer which is transporting the contaminants. An adequate ground water monitoring program, therefore, requires a large number of monitoring wells along the perimeter of the impoundment with a sufficient number of wells sampling water from different levels within the various aquifers beneath the impoundment. Even the most elaborate ground water monitoring system, however, cannot provide monitoring as accurate and timely as the invention system because of the inherent limitations discussed above.

One nonintrusive method for detecting and locating leaks in geomembrane liner systems uses an electrical measurement technique which takes advantage of the high electrical insulating properties of the liner with respect to the liquid contained above the liner and the soil underneath the liner. In general, geomembrane liners made from an impervious plastic material or rubber have a very high electrical resistance. A liner installed in a landfill or liquid impoundment, therefore, effectively acts as an electrical insulator between the materials contained within the facility and the surrounding environment. If the integrity of the liner is lost due to a puncture or separation, however, conductive liquid may then flow through the leak, thus establishing an electrical shunt through the liner between the contained liquid and the conductive earth in surrounding contact with the liner. The shunt is a low resistance path for current flow which forms an electrically detectable region corresponding to the a leak which may be detected and located.

The electrical measurement technique described above is discussed in greater detail in the publication "Electrical Resistivity Technique to Assess the Integrity of Geomembrane Liners," Final Technical Report, Southwest Research Institute, Project No. 14-6289, EPA Contract No. 68-03-3033 (1984), which by this reference is incorporated for all purposes.

SUMMARY OF THE INVENTION

The invention directional analyzer method and apparatus can be used for detecting leaks in either a single layer or a two layer geomembrane liner. Detection of a leak in either type of liner is based on an electrical measurement technique wherein electrical current from a source (either AC or DC) is injected into a liquid on one side of an essentially insulating enclosure and returned by a path in contact with the opposite side of the enclosure. A characteristic voltage gradient associated with the flow of the current through the contained liquid is established when current is injected into the liquid. An unfaulted liner will have a very low current flow and a characteristic distribution of current density throughout the body of the liquid. A leak in the liner, however, will cause a low resistance path between the contained liquid and the surrounding earth which causes an increased current flow in the liquid in the vicinity of the leak.

The directional potential analyzer consists of a vertical support column and a differential voltage detection probe attached to a radial support arm which is journaled for rotation on the vertical column. The analyzer is immersed in the conductive liquid contained in the impoundment. A source electrode mounted on the vertical column is connected via a cable to a remote power source and is operable to inject current into the contained liquid.

To detect and locate a leak in a single layer geomembrane liner, the directional potential gradient analyzer is placed in the center of the impoundment and the probe is radially oriented and rotated about the vertical support column. As the probe is moved through the liquid, the potential difference between the electrodes on the probe is measured and recorded as a function of the azimuthal position of the probe. An initial central radial scan is then displayed as a reference trace showing all of the leak responses in the liner analyzed. Subsequent traces obtained by rotating the analyzer probe at a later date are processed and compared with the reference trace to determine the occurrence of new anomalies representing leaks in the liner.

In an alternate embodiment of the invention, two directional analyzers are employed in the manner described above and a triangulation analysis is employed to obtain a more precise indication of the location of a leak.

The directional potential analyzer can also be employed to detect and locate perforations in either the upper or the lower sheet of a two layer geomembrane liner. To detect a perforation in the upper sheet of such a liner, the inter-liner zone between the upper and lower sheets is filled with a conducting liquid. The edge of the upper liner sheet is then temporarily raised and a return electrode is placed in the liquid contained in the inter-liner zone. A test current is injected into the impounded liquid contained in the upper liner and measurements of the type described above are taken from directional potential analyzers at plurality of locations within the impoundment. The location of the perforation is then determined by triangulation of the measurements taken at the various locations.

A perforation in the lower sheet of a two-layer geomembrane liner can be detected by injecting a test current into the liquid contained in the inter-liner zone with the return path for the current being provided by liquid passing through a perforation in the lower sheet to the sink electrode emplaced in the surrounding earth. The location of a perforation can then be determined by temporarily raising the edge of the upper liner and placing a source current electrode and potential gradient electrode pair in contact with the liquid contained in the inter-liner zone and a sink electrode in the surrounding earth. Then, the location of a leak can be determined by a plurality of potential gradient measurements at several such temporarily accessed source current electrode locations around the edge of the upper geomembrane liner. A triangulation analysis of the plurality of measurements is used to determine the location of the leak.

DETAILED DESCRIPTION OF THE PREFERRED EMBODIMENT

A. Detecting and Locating Leaks in Single Layer Geomembrane Liners

Figure 1:
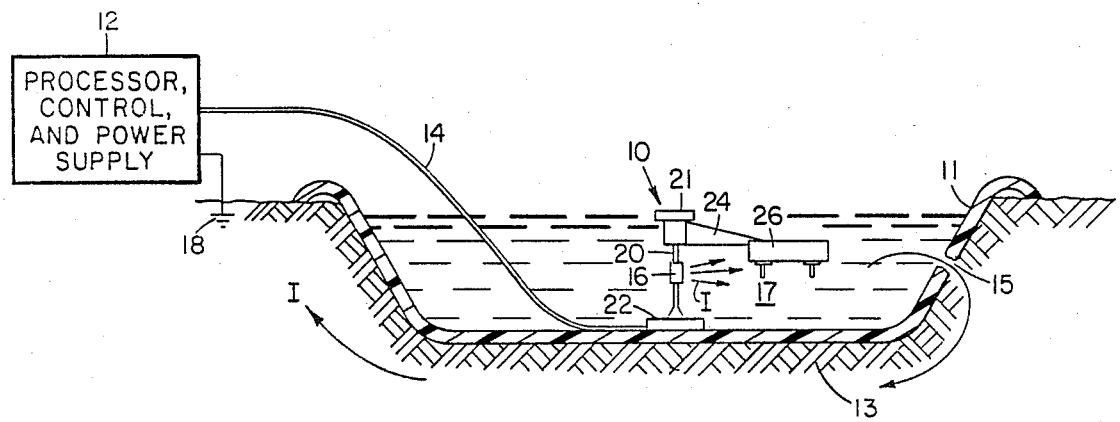
FIG. 1 is a sectional side view of a surface impoundment showing the directional analyzer leak detection monitor of the present invention immersed in liquid contained within the impoundment.
Figure 2:
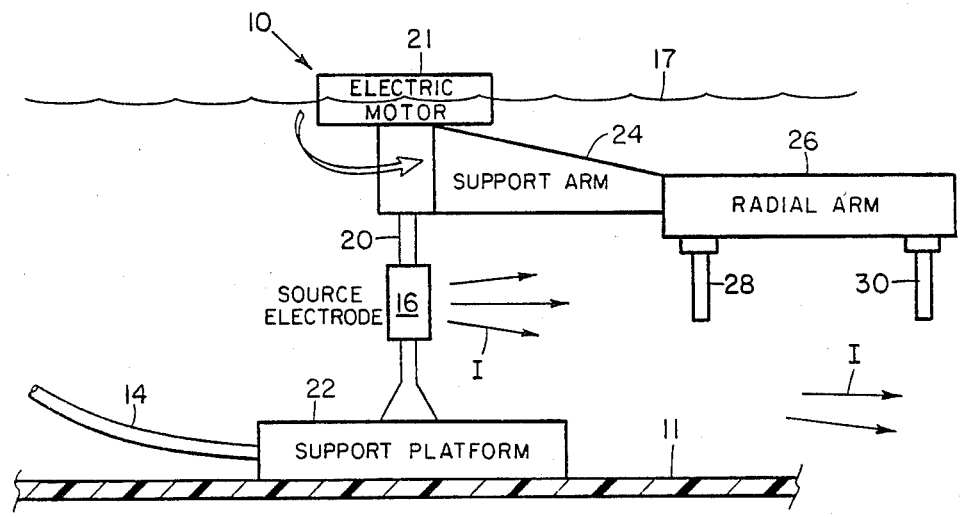
FIG. 2 is a detailed view of the directional analyzer shown in FIG. 1.
Figure 1A:
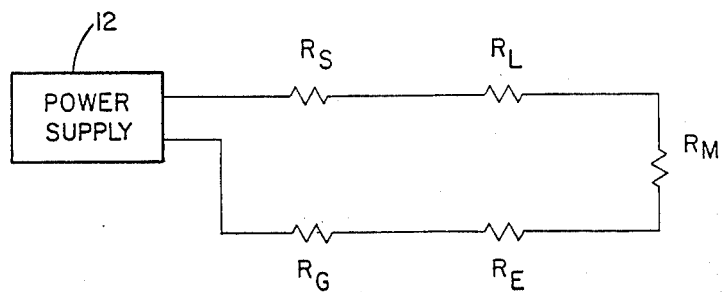
FIG. 1a is a schematic representation of the various equivalent resistances of the components of the leak detection system of the present invention.

The preferred embodiment of the directional potential analyzer 10 for utilizing the electrical measurement technique to detect and locate leaks in a single-layer geomembrane liner is shown generally in FIGS. 1 and 2. As can be seen in FIG. 1, the lower surface of the geomembrane liner 11 is in contact with an earthen pit 13. A hypothetical perforation 15 is shown in FIG. 1 establishing a low resistance path between the conductive liquid 17 contained in the liner 11 and the surrounding earth 13 in contact with the lower surface of the liner 11.

As can be seen best in FIG. 2, the potential analyzer 10 consists of a vertical support column 20 having a weighted lower support platform 22. A differential voltage detection probe 26 is attached to the distal end of a radial support arm 24 which is journaled for rotation on the vertical column 20. Rotational movement of the support arm 24 is provided by an electric motor 21 mounted on the upper end of vertical column 20. Differential voltage measurement electrodes 28 and 30 contained in the detection probe 26 are operable to measure voltage gradients in the liquid as the radial arm 26 is rotated in a circular path through the liquid 17.

In the preferred embodiment, a voltage source 12 is connected via a cable 14 to a source electrode 16 on the vertical column 20. A sink electrode 18 is connected to the voltage source to provide a return path for the current I passing through the liner 11. As can be seen best in FIG. 1, the source electrode 14 is immersed in the conducting liquid contained within the impoundment while the sink electrode 18 is secured in the conducting earth 13 at some point along the perimeter of the impoundment.

The total current I passing through the system is a function of the voltage of the voltage source 12 and the resistance of the contained liquid 17, the resistance of the geomembrane liner 11, the resistance of conducting earth 13 in surrounding contact with the liner 11 and the contact resistances of the source and sink electrodes 16 and 18, respectively.

The source electrode 16 attached to the vertical column 20 is in the form of a brass collar. Brass is particularly well suited as an electrode material for the invention apparatus because it has excellent conductive properties and is resistant to corrosion. The ground electrode 18 is comprised of a copper-clad steel rod which is driven into the ground to a depth of approximately 36 inches. Increased surface area for the ground electrode 18 can be achieved by connecting three rods of the type described above with a common conductor. The increased surface area of the multiple electrode arrangement reduces the voltage drop between the electrodes and the earth.

The geomembrane liner 11 is constructed of an impervious plastic or rubber material having a very high electrical resistance. Typical materials used to form the liner include high density polyethylene or polyvinyl chloride. The resistivity of the liner materials used in the preferred embodiment range from approximately $2 \times 10^{14}$ ohm-cm to $2 \times 10^{16}$ ohm-cm.

An unfaulted liner 11 has a very high electrical resistance for the reasons discussed above and, therefore, only a very small magnitude of current is able to pass therethrough. With the voltage source 12 connected to the impoundment having an unfaulted liner 11, the voltage produced by the source is divided approximately according to the resistance of the liquid, $R_L$, the resistance of the geomembrane liner, $R_M$, the resistance of the earth, $R_E$, and the contact resistances of the source electrode 16 and sink electrode 18, $R_S$ and $R_G$, respectively. The current flow produced by the voltage source 12 can be calculated from the relationship:

$$I = \frac{V}{R_L + R_M + R_E + R_S + R_G} \quad (1)$$

The liquid 17 contained in the impoundment forms a large distributed resistance in which the geometric distribution of current flow is dependent upon the size, shape, and depth of the body of the liquid 17 and the position of the source electrode 16 in the liquid body. This distribution of current can be characterized in large measure by the magnitude of current passing through each unit area of a closed surface surrounding the source electrode 16. Such a characterization of current is termed the current density. The total current, I, is the surface integral of the current density computed over any closed surface surrounding the source electrode 16. Thus, in the case of the geomembrane liner described above, since all of the source current must flow through the liquid-liner surface interface, the total current can be specifically represented by the integral of the current density over the liner surface defined by the liquid level line boundary. Intermediate surfaces within the liquid volume and located between the source electrode 16 and the liquid-liner interface can also be used in such surface integrations to compute the total source current.

By connecting points of equal current density on each successive intermediate surface between the current source electrode 16 and the liner, flow lines of constant current density can be established, thereby mapping the distribution of electric current within the volume of liquid 17 contained by the impoundment. By physical principle, each such current flow line will follow a path of least resistance from the source electrode 16 through the liquid and through the liner to the surrounding earth 13. If the liquid 17 and the liner have uniform resistivities, then the spatial distribution of the current within the liquid will be dependent only upon the size and shape of the liquid-liner interface and the position of the source electrode 16 within the geometry defined by that interface. In the case of an unfaulted geomembrane liner, the resistance contrast between the high resistivity liner and the more conductive liquid 17 will be such that the current density through the liquid-liner surface and through the various intermediate surfaces located well away from the source electrode 16 will be relatively uniform.

The finite resistivity of the liquid 17 contained within the liner causes a voltage drop between the surface of the source electrode 16 and the liner 11 when the source power supply 12 is energized. This voltage drop, $V_L$, is expressed by:

$$V_L = IR_L = \left( \frac{R_L}{R_L + R_M + R_E + R_S + R_G} \right) V. \quad (2)$$

Because the resistance of the liquid body 17, $R_L$, is a distributed resistance, there are also voltage differences within the body of the liquid 17. In particular, along each line of constant current density there are incremental voltage drops whose sums can be considered to be approximately equal to the total voltage drop, $V_L$, in the liquid 17. By connecting points of equal potential along each line of constant density, specific surfaces, termed equipotential surfaces, are identified and the vector directions normal to such equipotential surfaces (parallel to the current density flow direction at each point on the surface) define the direction of the potential gradient within the body of the liquid. Such equipotential surfaces and potential gradients are important to this invention since, by their measurement and interpretation, anomalous conditions of current density distribution within the impounded liquid 17 can be measured and interpreted to reveal the presence and location of the leak 15 in the liner 11.

When the current density within the contained liquid 17 is relatively uniform, as in the case of an unfaulted liner 11, the voltage gradients in the body of the liquid 17 are small. When a leak 15 is present in the liner 11, the current flow through the liner 11 tends to concentrate along the lower resistance path through the leak 15, thereby causing higher voltage gradients in the vicinity of the leak 15. These anomalous changes in the potential gradients also change the spatial location and shapes of the equipotential surfaces mentioned above.

In the absence of a leak 15, little or no current will flow through the impoundment. If a perforation 15 develops over time, however, the current I flow through the impoundment will increase because of the low resistance shunt created at the leak 15 between the contained liquid 17 and the surrounding earth 13, as described above.

As was discussed above a perforation 15 in the liner 11 will cause an increased flow of current I which can be detected as a change in the spacing between the equipotential lines of the voltage gradient. This distortion of the equipotential lines can be used to detect the location of a leak by moving a differential probe through the field gradient of the impoundment in a circular search pattern described hereinbelow.

The detection probe 26 operates by detecting a potential difference between the inner and outer electrodes 28 and 30, respectively, of the probe 26 as the probe is rotated through the gradient. Higher current density within the liquid volume occurs in the direction of a leak 15 for the reasons discussed above. The probe 26 measures the larger potential difference associated with the directional current flow through the leak, thus detecting the leak as an increase in voltage between the electrodes 28 and 30.

As the probe 26 is rotated in the liquid, the distribution of the current flowing through the liquid as a function of azimuth angle from the current electrode is measured. When the impoundment is new and all leaks resulting from construction defects have been repaired, the initial signature can also be stored on a magnetic disc as a permanent reference. Subsequent signatures are then compared with the reference signature to determine what changes have occurred. Any perforation, conductive pipe, or continuous path for liquid to flow into or out of the geomembrane liner will cause the current distribution to change.

The potential between the electrodes 28 and 30 is measured as the radial arm 24 revolves around the vertical support column 20. A digital position indicator 32 will produce data representing the azimuthal angle. The potential measurement data and the azimuthal angle data are recorded in a digital memory for each angle as the probe 26 rotates, thereby creating a radial current flow distribution signature of the impoundment.

Figure 3:
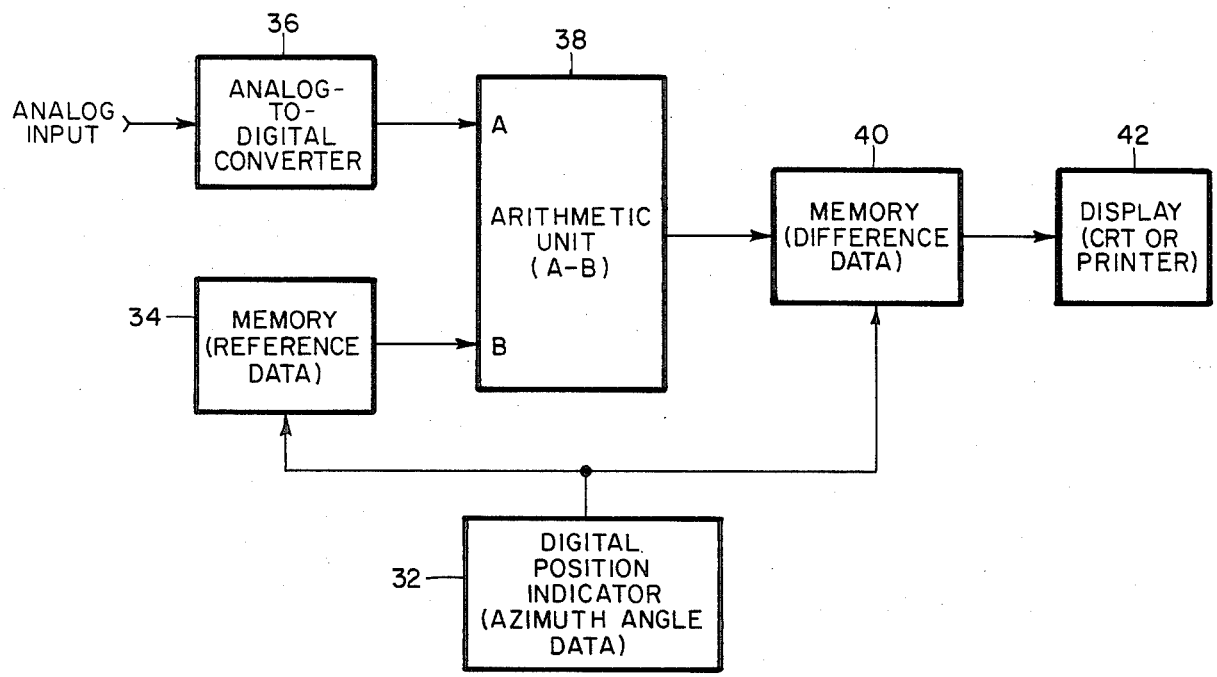
FIG. 3 is a schematic block diagram of the signal processing circuitry of the present invention.

FIG. 3 is a schematic block diagram of the processing functions required to obtain a signature trace of an impoundment. The analog potential measurements from the differential amplifier contained in the differential probe 26 are converted to digital form by the analog-to-digital converter 36. The transformed data are then transferred via the cable 14 to the processor unit contained in the same enclosure as the power supply 12. These data are referenced to the azimuth position of the radial support arm 24 by using the output of the digital position indicator 32. All processing is performed in the control, processor, and power supply unit 12.

Figure 4:
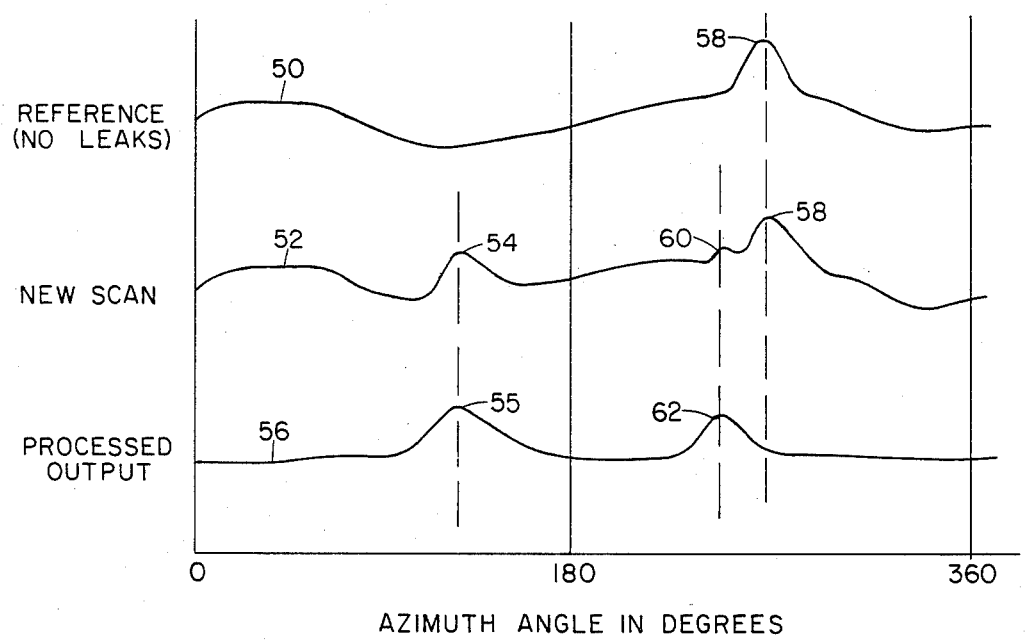
FIG. 4 is a graphical representation of the output of the signal processing circuit of FIG. 3.

An example of the graphical results of the data processing is shown in FIG. 4. The upper trace 50 shows the radial current directional distribution signature of an impoundment. This is used as the reference signature, and includes the effects of intentional conductive paths such as a drain pipe indicated by the anomaly 58. A scan made at a later time and having new anomalies 54 and 60 could have the characteristic shown on the second trace 52. After processing to remove the reference information contained in the upper trace, such as the drain pipe anomaly, the third trace 56 showing only the new anomalies 55 and 62 is produced. The processed output clearly shows the changes in current distribution resulting from any change in conductive paths through the geomembrane.

B. Extension of the Technique to Obtain More Precise Location of an Anomaly

As was discussed above, the directional potential analyzer 10 is operated to determine only the azimuth angle of the anomalies with respect to the measurement unit location. By using two or more measurement units, however, the azimuthal data can be processed by a triangulation analysis to indicate the actual location of the anomaly. The processing unit would, therefore, produce a plot of the impoundment showing the location of the anomalies.

C. Application of the Technique to Two-Layered Geomembrane Liners

Geomembranes are commonly installed as single-layer sheets and, in general, have demonstrated effectiveness in preventing excessive leakage out of such lined impoundments. However, because many geomembranes develop leaks after being installed and because of the difficulties in locating those leaks, the added practice of employing two liners with a drainage sump connected to the inter-liner zone has emerged as an extra safeguard against undesirable leakage.

Figure 5:
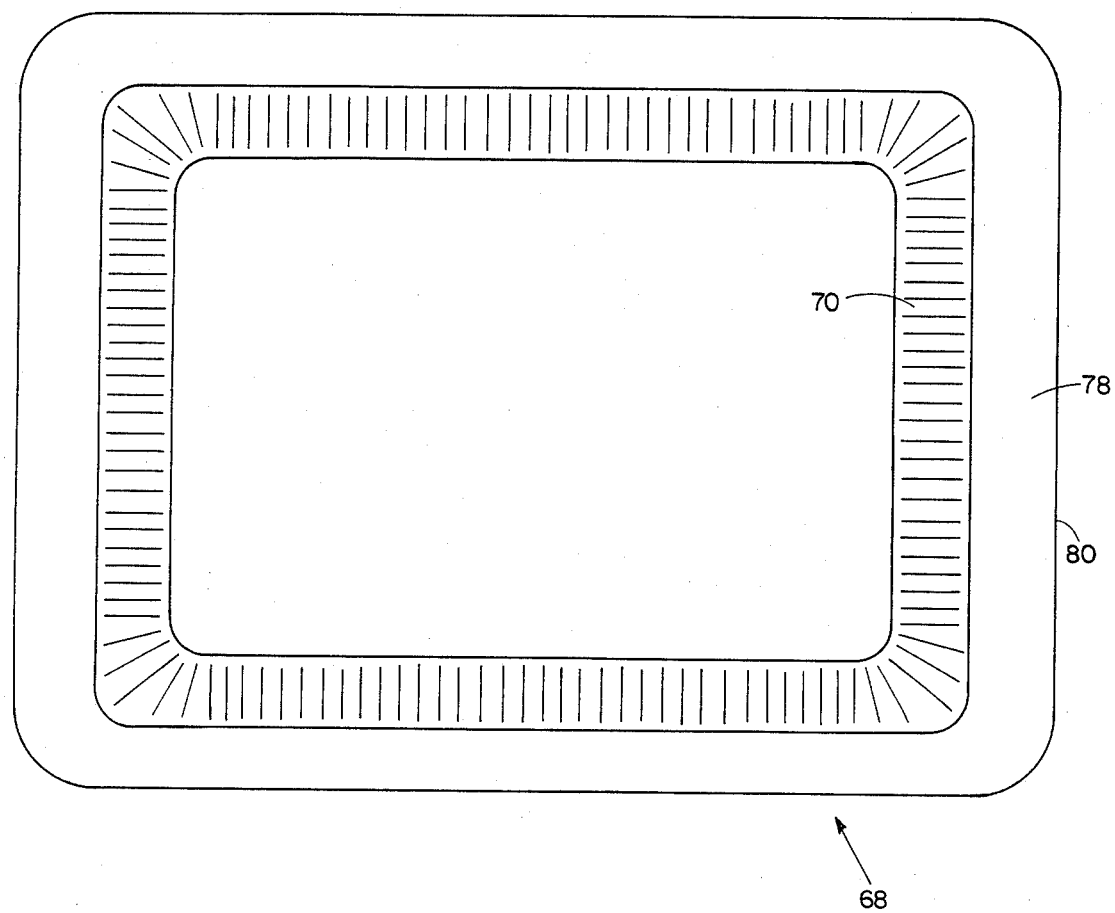
FIG. 5 is a top plan view of a two-layered geomembrane liner.
Figure 6:
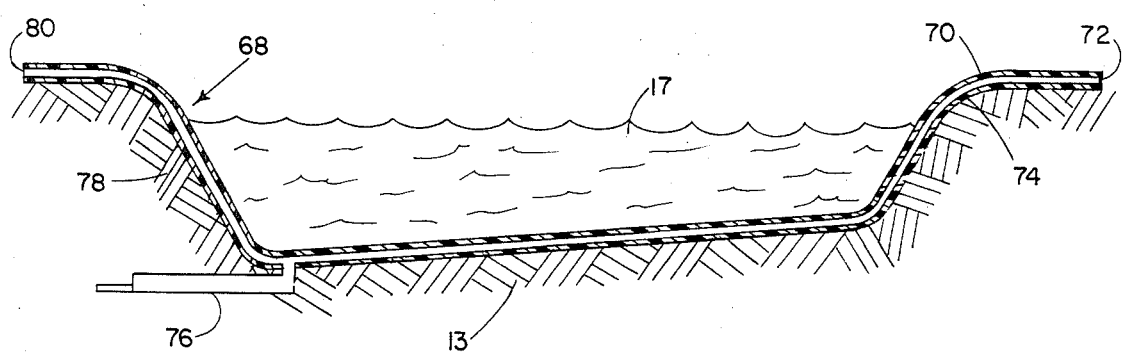
FIG. 6 is a cross-sectional side view of a two-layer geomembrane liner showing details relating to the upper and lower liner sheets and the inter-liner zone.

A typical two-layered geomembrane liner 68 is shown generally in FIGS. 5 and 6. The liner comprises upper and lower sheets 70 and 74 and an inter-liner zone 72. The liner 68 extends across the lower surface of an earthen pit 13 with the circumferential edges of the liner extending upwardly over the berm shoulder 78 with the liner edges 80 being secured in the earth along the upper perimeter of the pit 13.

The electrical leak location method described above may be used as a direct means for detecting leaks in the upper liner sheet 70. However, for this purpose, an electrical conductor must be in contact with the back side of the liner sheet 70 to serve as the return path for any currents flowing through perforations in the sheet. This electric contact on the lower side of the upper liner 70 may be provided by allowing liquid to enter the inter-liner zone 72 via gravity-feed back flow into the sump drain 76. The inter-liner zone 72 and sump drain 76 are used as the current return path in a manner similar to that in which the surrounding earth 13 is used as the return when testing single-layer liners. Perforations in the upper liner 70 are then located using the same technique described hereinabove for single-layer liners. This leak detection process, applicable to the upper liner sheet 70, is the first phase in detecting perforations in a two-layered geomembrane liner.

Leak location in the lower liner sheet 74 using electrical current and potential gradient measurements in the manner described earlier is impaired because of the two-layer structure. In particular, although current can be injected into the liquid-flooded inter-liner zone 72 to flow through any leak paths penetrating the lower liner 74 and return to the surrounding earth 13, the associated potentials within the inter-liner zone 72 are inaccessible to direct measurement. Therefore, a different method of potential measurement and interpretation is required in order to locate the leaks in the lower liner 74.

The method of potential gradient measurement and leak location interpretation in the inter-liner zone 72, in conjunction with the idea of liquid-flooding the inter-liner zone 72 to allow current to be injected into the inter-liner zone 72 and returned through any leak paths in the lower liner 74, is the second phase in detecting a leak in a two-layered geomembrane liner 68.

Again, FIGS. 5 and 6 illustrate a two-layer geomembrane installation and the physical characteristics of the double-layer structure. When the inter-liner zone 72 is filled with liquid and electrically grounded to the surrounding earth 13, the leak detection and location measurements can be applied to the upper geomembrane layer 70. When the liquid-filled inter-liner zone 72 is used to carry injected current I which returns to ground through perforations in the lower geomembrane layer, the method is applicable to detecting and locating leaks in the lower liner 74.

Figure 7:
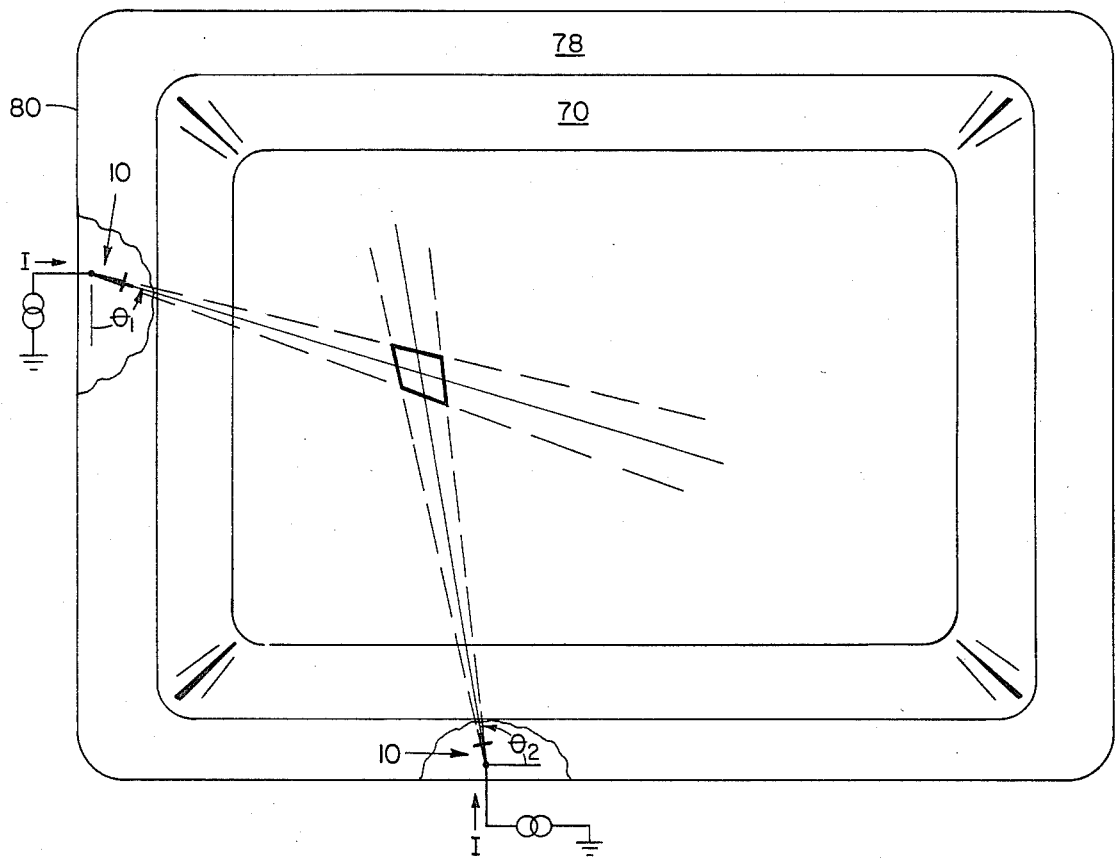
FIG. 7 is a partial top plan view showing the orientation of the test stations used to detect a leak in a two-layer geomembrane liner.
Figure 8:
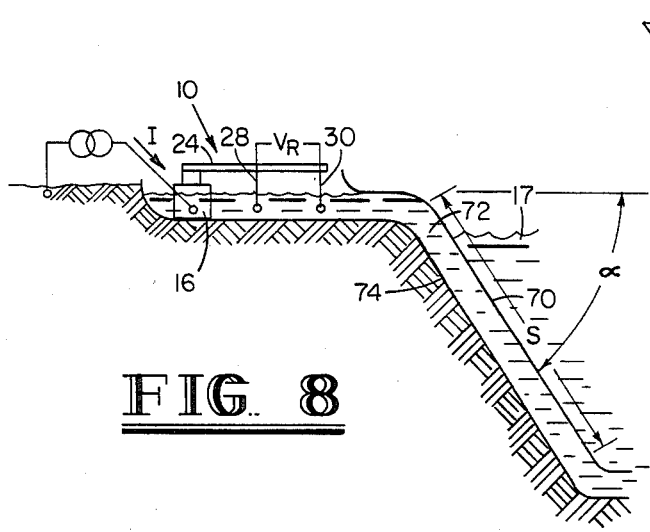
FIG. 8 is a detailed cross-sectional side view of one of the test stations shown in FIG. 7.
Figure 9:
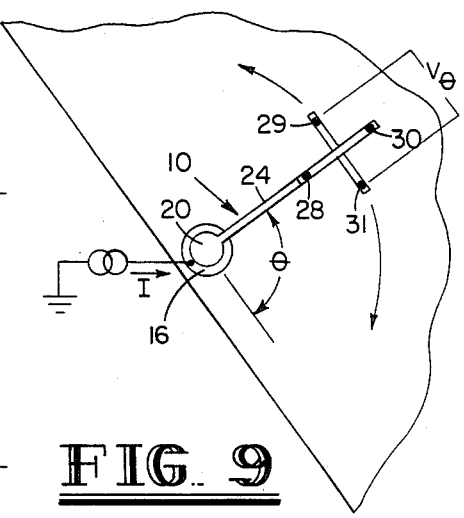
FIG. 9 is a detailed top plan view of the test station shown in FIG. 8.

The method required to detect and locate leaks in the lower geomembrane liner 74 is shown generally in FIGS. 7 through 9. First, the inter-liner zone 72 is filled with liquid to the extent that the liquid rises above the impounded liquid level and up to elevation of the top of the shoulder of the surrounding earth berm 78 which forms the impoundment.

At several positions on the berm shoulder 78 surrounding the impoundment, the upper liner sheet 70 is temporarily raised or removed to gain access to the liquid filling the inter-liner zone 72. The test current is injected at each of these positions sequentially and localized potential gradient measurements are made as a function of azimuth angle, $\theta$. These azimuthal gradient scans provide information on the directions of highest current density away from the current source electrode. The strongest current flow is oriented toward the location(s) of the leak positions through which the current returns to the surrounding earth, for the reasons discussed above. By analyzing the potential gradient amplitudes observed and recorded at several test positions, the localized position of the leak(s) may be determined by triangulation based upon the directions of strongest current flow. Triangulation is possible since the distance between the test positions is known and this distance, together with the measured azimuthal angles, forms a triangle, the apex of which is the location of the leak.

The radial potential gradient represented by the voltage, $V_R$, measured by electrodes 28 and 30, and the azimuthal potential gradient represented by the voltage measurement, $V_\theta$, measured by electrodes 29 and 31 will provide relatively accurate angular resolution of the leak position direction. The radial gradient will exhibit a peak value in the direction of the leak, while the azimuthal gradient will exhibit a sharply defined null in the direction of the leak. Direction indications from at least two test positions are required to establish the localized position of the leak. Direction indications from more than two positions are desirable in order to confirm and better localize the leak location.

An extension of this technique is one which employs additional potential measurement electrodes to facilitate measurements of higher order gradients. The electrode pairs 28, 30 and 29, 31 shown in FIG. 9 provide gradient measurements which are approximately equal to the first derivative (either radial or azimuthal) of the potential distribution surrounding the current injection electrode. By using two such pairs of potential electrodes spaced appropriately along the potential measurement arm, the second derivative of the potential distribution may be determined. Leak direction determinations based upon the use of higher-order gradient measurements will provide sharper angular resolution and, hence, greater leak position accuracy.

An important point to be noted is the fact that since the currents being conducted from the injection electrode to the perforation(s) in the lower liner 74 are confined to the two-dimensional inter-liner layer 72 which is assumed to be filled with liquid, any curvatures in the double liner such as at the shoulder of the berm 78 and at the bottom of the side slopes of the impoundment do not affect the ability of the method to establish useful azimuthal directions oriented toward the perforation(s). However, the slope of the berm will introduce an apparent lateral offset effect between the observed azimuthal direction and the leak location. In this case, the offset distance, $\Delta$, may be compensated for in plan-view plots such as that shown in FIG. 1 by the relationship (for flat impoundment bottom), $$\Delta = S(1 - \cos\theta) \cot\theta$$

wherein
S = slant length of the impoundment slope;
$\alpha$ = depression angle of the impoundment slope;
$\theta$ = azimuthal direction of the observed leak detection, as shown in FIG. 8. The direction of the offset distance, $\Delta$, is such that the true leak location is always further away from the $\theta = 90°$ normal line than the simple projection of the observed $\theta$ direction would imply.

The invention directional potential analyzer method and apparatus for detecting and locating perforations in geomembrane liners offers numerous advantages over previous methods for detecting leaks in such liners.

Although the invention method has been described in connection with the preferred embodiment, this embodiment is not intended to limit the invention to the particular form set forth, but on the contrary, it is intended to cover such alternatives, modifications, and equivalents as may be included within the spirit and scope of the invention as defined by the appended claims.

We claim:

1. A directional potential analyzer for detecting and locating a leak in a geomembrane liner having a high electrical resistivity, said liner having one face in contact with a conductive liquid contained by said liner and having the opposite face in contact with a conducting material, comprising:

a vertical support column immersed in said liquid;
    a radial support arm journaled for rotation on said vertical column;
    a source electrode mounted on said vertical column;
    a sink electrode in contact with said conducting material;
    a power source in series with said source electrode and said sink electrode;
    voltage gradient detection means attached to said radial support arm, said detection means comprised of first and second electrodes for detecting voltages in said liquid and for producing an output signal in response thereto;
    means for rotating said support arm through a plurality of azimuthal angles about said vertical column; and
    means for monitoring said output signal at each said azimuthal angle, said monitoring means adapted to correlate said output of said voltage gradient detecting electrodes at each said azimuthal angle with the location of a leak in said linear.

2. A directional potential analyzer according to claim 1, said means for rotating said radial support arm comprising an electric motor mounted on said vertical support column.

3. A directional potential analyzer according to claim 1, said voltage gradient detection means comprising a differential amplifier connected to said first and second electrodes, said differential amplifier operable to generate said output signal representing a potential voltage difference between said first and second electrodes.

4. A directional potential analyzer according to claim 1, said voltage gradient detection means comprising direction indicator means operable to produce a position indicator signal corresponding to the azimuthal angle of said radial support arm.

5. A directional potential analyzer according to claim 4, further comprising signal processing means for correlating said position indicator signal with said differential amplifier output signal, thereby providing a representation of voltage gradient in said liquid as a function of azimuthal angle of said radial support arm.

6. A method of locating a leak in geomembrane liner having a high electrical resistivity, said liner having one face in contact with a conductive liquid contained by said liner and having the opposing face in contact with a conducting material, comprising the steps of:

placing a first directional voltage gradient detection means in said fluid, said first gradient detection means comprising a first source electrode and first and second voltage detection electrodes;

creating a first voltage drop between said first source electrode and said conducting material;

rotating said first voltage gradient detection means through a first plurality of azimuthal angles;

obtaining a first measurement of voltage gradient between said first and second voltage detection electrodes at each said azimuthal angle;

processing said first measurement of voltage gradient between said first and second voltage detection electrodes at each said azimuthal angle;

placing a second directional voltage gradient detection means in said liquid, said second detection means having a second source electrode and third and fourth voltage detection electrodes;

creating a second voltage drop between said second source electrode and said conducting material;

rotating said second directional voltage gradient detection means through a second plurality of azimuthal angles;

obtaining a second measurement of voltage gradient between said third and fourth voltage detection electrodes at each said azimuthal angle;

processing said second measurement of voltage gradient at each said azimuthal angle of said second detection means to obtain a representation of voltage gradient in said liquid as a function of azimuthal angle of said second detection means; and correlating said representation of voltage gradient obtained from said first and second voltage gradient detection means with the location of a leak in said liner.

* * * * *